United States Patent
Kim et al.

(10) Patent No.: US 6,632,323 B2
(45) Date of Patent: Oct. 14, 2003

(54) METHOD AND APPARATUS HAVING PIN ELECTRODE FOR SURFACE TREATMENT USING CAPILLARY DISCHARGE PLASMA

(75) Inventors: Steven Kim, Harrington Park, NJ (US); Seok-Kyun Song, Ridgefield, NJ (US); Dong Woo Yu, Demarest, NJ (US)

(73) Assignee: Plasmion Corporation, Hoboken, NJ (US)

( * ) Notice: Subject to any disclaimer, the term of this patent is extended or adjusted under 35 U.S.C. 154(b) by 48 days.

(21) Appl. No.: 09/772,850

(22) Filed: Jan. 31, 2001

(65) Prior Publication Data

US 2002/0100556 A1 Aug. 1, 2002

(51) Int. Cl.$^7$ ............................ H05H 1/00; C23C 16/00
(52) U.S. Cl. ........................ 156/345.43; 156/345.47; 156/345.34; 156/345.33; 118/723 E; 118/723 DC
(58) Field of Search .................. 156/345.43, 345.47, 156/345.34, 345.33; 118/723 E, 723 DC, 723 HC, 723 ER; 204/298.31, 298.39, 298.41, 192.11, 192.12, 192.34; 315/111.21, 111.81

(56) References Cited

U.S. PATENT DOCUMENTS

| | | | | |
|---|---|---|---|---|
| 3,594,065 A | * | 7/1971 | Marks | ........................ 359/296 |
| 4,166,986 A | * | 9/1979 | Hundstad et al. | ........ 372/38.05 |
| 4,201,921 A | | 5/1980 | McCorkle | ................... 250/493 |
| 4,538,163 A | * | 8/1985 | Sheridon | .................... 347/125 |
| 5,609,690 A | * | 3/1997 | Watanabe et al. | ........ 118/723 E |
| 5,716,500 A | * | 2/1998 | Bardos et al. | ......... 204/192.12 |

FOREIGN PATENT DOCUMENTS

| | | | | |
|---|---|---|---|---|
| DE | 197 27 883 A1 | 1/1998 | | ............ H05H/1/46 |
| JP | 57-067271 A | 4/1982 | | ............ H01J/35/00 |
| JP | 63-239755 A | 10/1988 | | ............ H01J/35/22 |
| JP | 5-136507 A | * | 6/1993 | ......... H01S/3/0977 |
| WO | WO 00/79843 A1 | 12/2000 | | ............ H05H/1/24 |
| WO | WO 01/44790 A1 | 6/2001 | | .......... G01N/21/73 |

* cited by examiner

*Primary Examiner*—Parviz Hassanzadeh
(74) *Attorney, Agent, or Firm*—Morgan, Lewis & Bockius LLP

(57) ABSTRACT

A method and an apparatus for treating a workpiece using a plasma are disclosed in the present invention. In treating a workpiece using a plasma, the apparatus includes at least one pin electrode for receiving a power source, a dielectric body having first and second sides, wherein the first side is coupled to the pin electrode and the second side has at least one capillary extending to a direction of the first side of the dielectric body, and each capillary is substantially aligned with each pin electrode, and a counter electrode electrically coupled to the pin electrode for generating the plasma from each capillary.

9 Claims, 15 Drawing Sheets

Air Plasma 0 sec 20 sec 80 sec 80 sec

Ar Plasma 0 sec 20 sec 80 sec 80 sec

METHOD AND APPARATUS HAVING PIN ELECTRODE FOR SURFACE TREATMENT USING CAPILLARY DISCHARGE PLASMA

BACKGROUND OF THE INVENTION

1. Field of the Invention

The present invention relates to a plasma discharge apparatus, and more particularly to a method and an apparatus having pin electrode for surface treatment using capillary discharge plasma shower. Although the present invention is suitable for a wide scope of applications, it is particularly suitable for plasma treatment of workpieces under an atmospheric pressure or a high pressure, thereby providing virtually unrestricted applications regardless of size of the workpieces.

2. Discussion of the Related Art

A plasma discharge has been widely used for treating surfaces of a variety of workpieces in many different industries. Particularly, a station for cleaning or etching electronic components, such as a printed circuit board (PCB), lead frame, microelectronic device, and wafer, has been employed in electronics industries since it provides advantages over the conventional chemical cleaning apparatus. For example, the plasma process occurs in a closed system instead of in an open chemical bath. Thus, the plasma process may be less hazardous and less toxic than the conventional chemical process. One example of a related background art plasma process and apparatus was disclosed in U.S. Pat. No. 5,766,404.

Another example of the related background art was disclosed in "Surface Modification of Polytetrafluoroethylene by Ar+Irradiation for Improved Adhesion to Other Materials", *Journal of Applied Polymer Science,* pages 1913 to 1921 in 1987, in which the plasma process was applied on the surfaces of plastic workpieces in an effort to improve wetability or bonding of the workpieces.

All of the background art plasma processes, however, have to be carried inside a treatment chamber because the background art plasma processes can only be performed under a vacuum condition. Thus, when a workpiece is too big to be treated in the chamber, the background art plasma process cannot be used to treat the workpiece. As a result, the background art plasma processes are very limited in applications.

SUMMARY OF THE INVENTION

Accordingly, the present invention is directed to a method and an apparatus for plasma treatment using capillary discharge plasma that substantially obviate one or more of the problems due to limitations and disadvantages of the related art.

Another object of the present invention is to provide a method and an apparatus for plasma treatment using capillary discharge plasma which can be applied in sterilization, cleaning, etching, surface modification, or deposition of thin film under a high pressure or an atmospheric pressure condition.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, an apparatus for treating a workpiece using a plasma includes at least one pin electrode for receiving a power source, a dielectric body having first and second sides, wherein the first side is coupled to the pin electrode and the second side has at least one capillary extending to a direction of the first side of the dielectric, and each capillary is substantially aligned with each pin electrode, and a counter electrode electrically coupled to the pin electrode for generating the plasma from each capillary.

In another aspect of the present invention, an apparatus for treating a workpiece using a plasma includes a dielectric body having at least one opening extending therethrough, at least one dielectric tube having first and second openings, wherein the dielectric tube coupled to the dielectric body through the opening of the dielectric body, at least one pin electrode coupled to the first opening of the dielectric tube, and a counter electrode electrically coupled to the pin electrode for generating the plasma.

In another aspect of the invention, a method of treating a workpiece using a plasma discharge apparatus includes the steps of placing the workpiece in close proximity to the apparatus, wherein the apparatus includes, at least one pin electrode for receiving a power source, a dielectric body having first and second sides, wherein the first side is coupled to the pin electrode and the second side has at least one capillary extending to a direction of the first side of the dielectric, and each capillary is substantially aligned with each pin electrode, and a counter electrode electrically coupled to the pin electrode, applying a potential to the pin electrode and the counter electrode, and generating a plasma out of the capillaries.

In a further aspect of the present invention, a method of treating a workpiece using a plasma discharge apparatus includes the steps of placing the workpiece in close proximity to the apparatus, wherein the apparatus includes, a dielectric body having at least one opening extending therethrough, at least one dielectric tube having first and second openings, wherein the dielectric tube coupled to the dielectric body through the opening of the dielectric body, at least one pin electrode coupled to the first opening of the dielectric tube, and a counter electrode electrically coupled to the pin electrode, applying a potential to the pin electrode and the counter electrode, and generating a plasma out of the capillaries.

Furthermore, several workpieces can be automatically treated by the apparatus by placing the workpieces on a conveyer that passes under the plasma.

It is to be understood that both the foregoing general description and the following detailed description are exemplary and explanatory and are needed to provide further explanation of the invention as claimed.

BRIEF DESCRIPTION OF THE DRAWINGS

The accompanying drawings, which are included to provide a further understanding of the invention and are incorporated in and constitute a part of this specification, illustrate several embodiments of the invention and together with the description, serve to explain the principles of the invention.

In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1A:
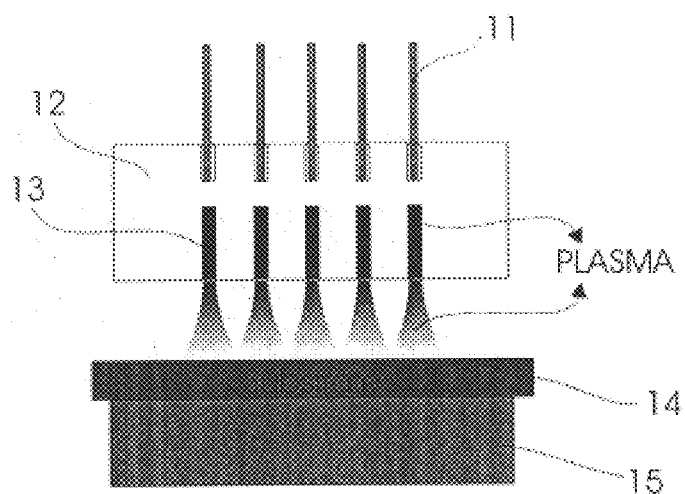
FIG. 1A is a schematic cross-sectional view of a capillary discharge plasma head of an A-type apparatus showing plasma for treating conductive workpieces in the present invention.

FIG. 1A is a schematic cross-sectional view of a capillary discharge plasma head of an A-type apparatus showing plasma from each capillary in surface treatment of conductive workpieces. The apparatus head, discharges plasma over the substrate to be treated. As illustrated in FIG. 1A, the pin electrodes are not exposed to the capillaries. A more detailed description of such features will be given with reference to FIG. 1B.

Figure 1B:
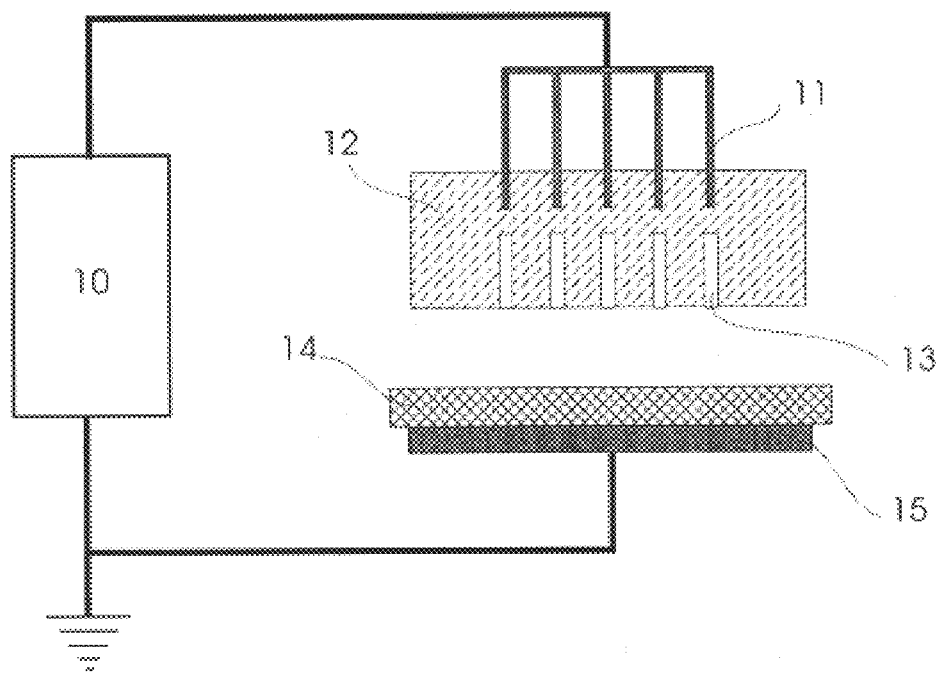
FIG. 1B is a schematic cross-sectional view illustrating an A-type apparatus for plasma surface treatment for conductive workpieces in the present invention.

FIG. 1B is a schematic cross-sectional view illustrating an A-type apparatus for plasma surface treatment for conductive workpieces. As shown in FIG. 1B, an A-type apparatus for plasma treatment according to a first embodiment of the invention comprises an AC power supply 10, pin electrodes 11, a dielectric body 12, capillaries 13 formed in the dielectric body 12, conductive workpiece 14 and a counter electrode 15 electrically coupled to the pin electrodes.

One of the terminals of the power supply is coupled to pin electrodes 11, while the other terminal is coupled to the counter electrode 15 and is grounded. The dielectric body 12 has first and second sides, the first side coupled to the pin electrodes 11, and the second side having at least one capillary that extends into a portion of the dielectric body 12. The pin electrodes 11 and the capillaries 13 are substantially aligned and generally have a one to one correspondence. Although there is no critical limitation in a thickness of the dielectric body 12, the thickness of the dielectric body 12 may be in the range of 1 mm to 3 cm. A diameter of each capillary is preferably in the range of 0.2 mm to 0.8 mm. A conductive substrate is placed between the pin electrodes 11 and the counter electrode 15 connected to the power supply 10 and subjected to a plasma treatment using capillary discharge plasma. As illustrated in FIG. 1B, a portion of the dielectric body 12 separates the capillaries from the pin electrodes 11, thereby preventing a glow-to-arc transition in treating the conductive workpieces.

Figure 1C:
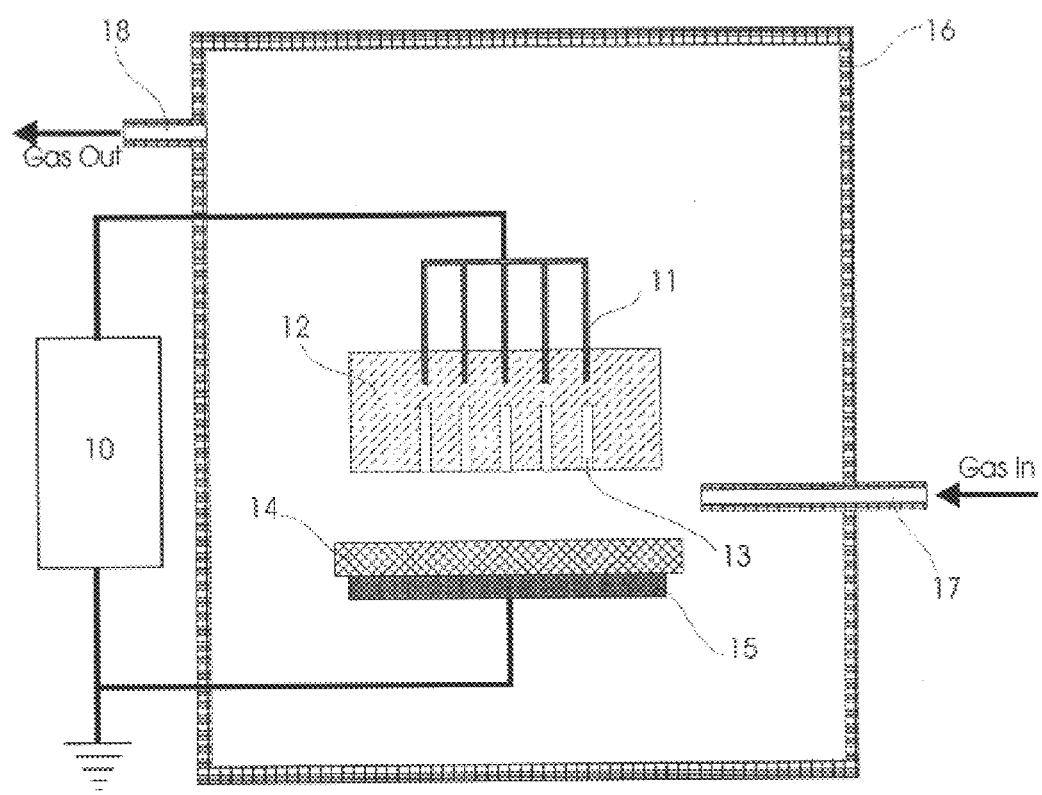
FIG. 1C is a schematic cross-sectional view illustrating an A-type apparatus for plasma surface treatment of conductive workpieces placed in a gas chamber in the present invention.

FIG. 1C illustrates a schematic cross-sectional view of the A-type apparatus housed in a gas chamber 16. The gas chamber 16 has at least two openings 17 and 18, that allow gases to be inserted and removed from the chamber. Any type of gas or gases may be inserted into the chamber such as Ar, He, oxygen and air. Although any gases can be inserted and removed from the chamber, it is not necessary to create a vacuum in the chamber 16 to treat the workpiece 14 because the apparatus utilizes high efficiency capillary discharge plasma. All that is needed is an isolated space for maintaining an atmospheric pressure. Furthermore, the chamber 16 allows treating the workpiece 14 under a working gas environment other than air.

Figure 2:
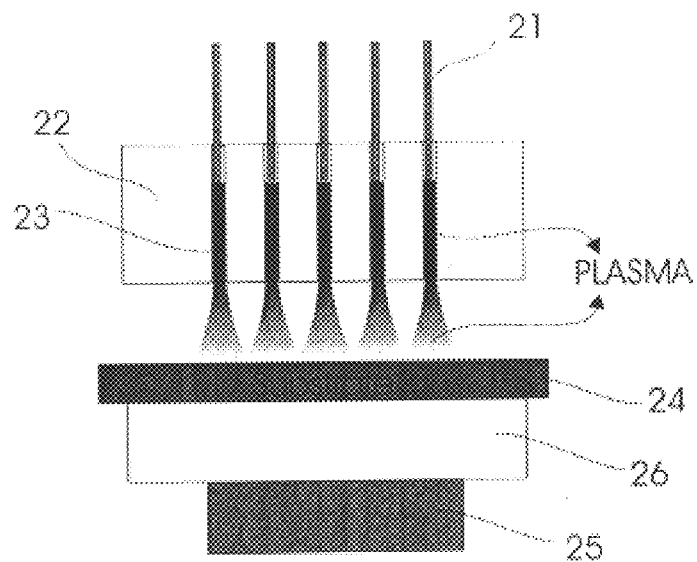
FIG. 2A is a schematic cross-sectional view of a capillary discharge plasma head of a B-type apparatus showing plasma for treating nonconductive substrates in the present invention.
FIG. 2B is a schematic cross-sectional view illustrating a B-type apparatus for plasma surface treatment for nonconductive workpieces in the present invention.
Figure 2:
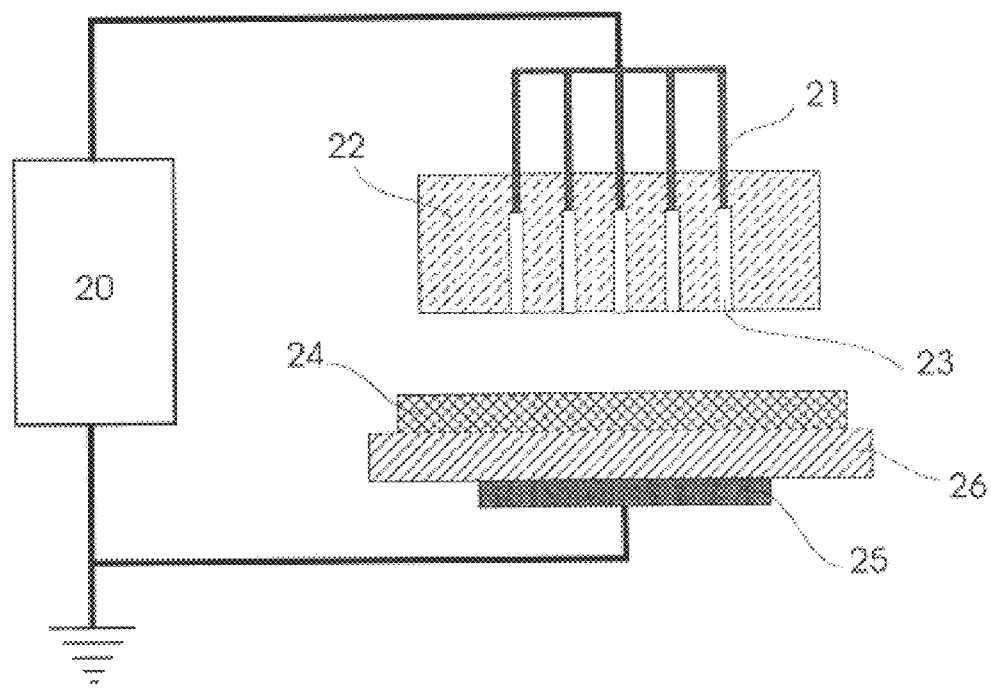

FIG. 2A is a schematic cross-sectional view of a capillary discharge plasma head of a B-type apparatus showing plasma from each capillary for plasma surface treatment of non-conductive workpieces. The apparatus head, discharges plasma over the workpiece, which is placed between electrodes 21 and 25. As illustrated in FIG. 2B the pin electrodes 21 are exposed by the capillaries. A more detailed description of the B-type apparatus will be given with reference to FIG. 2B.

FIG. 2B is a schematic cross-sectional view illustrating a B-type apparatus for plasma surface treatment for non-conductive workpiece. Similar to the A-type apparatus, the B-type apparatus includes an AC power supply 20, pin electrodes 21, a dielectric body 22, capillaries 23, a non-conductive workpiece 24, a counter electrode 25 and a dielectric plate 26. The pin electrodes 21 are connected to a first terminal of the power supply 20 and the counter electrode 25 is connected to a second terminal of the power supply 20. The second terminal of the power supply 20 is ground. The dielectric body 22 has first and second sides, wherein the second side has at least one capillary extending into a portion of the dielectric body 22. The pin electrodes 21 are placed in the first side of dielectric 22 and extend into the capillaries 23. Similar to the A-type apparatus, the capillaries formed in the first dielectric or dielectric body 22 may range in number from one to thousands depend upon the dimension of the dielectric body 22. A thickness of the dielectric body 22 may be in the range of 1 mm to 3 cm. A diameter of each capillary is preferably in the range of 0.2 to 0.8 mm. The B-type apparatus also includes a dielectric plate 26 placed between the counter electrode 25 and the workpiece 24. The non-conductive workpiece 24 is placed on top of the dielectric plate 26 and is subjected to a plasma treatment using the capillary discharge plasma.

Figure 3:
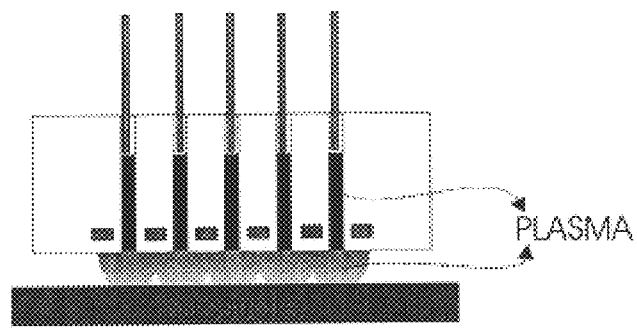
FIG. 3A is a schematic cross-sectional view of a capillary discharge plasma head of a C-type apparatus showing plasma for treating conductive, semiconductive, and nonconductive workpieces in the present invention.
FIG. 3B is a schematic cross-sectional view illustrating a C-type apparatus for plasma surface treatment for conductive, semiconductive, and nonconductive workpieces in the present invention.
FIG. 3C is a top view of a dielectric body with electrodes placed on its surface in the present invention.
FIG. 3D is a schematic cross-sectional view illustrating a dielectric body and a dielectric plate with electrodes placed therein in the present invention.
Figure 3:
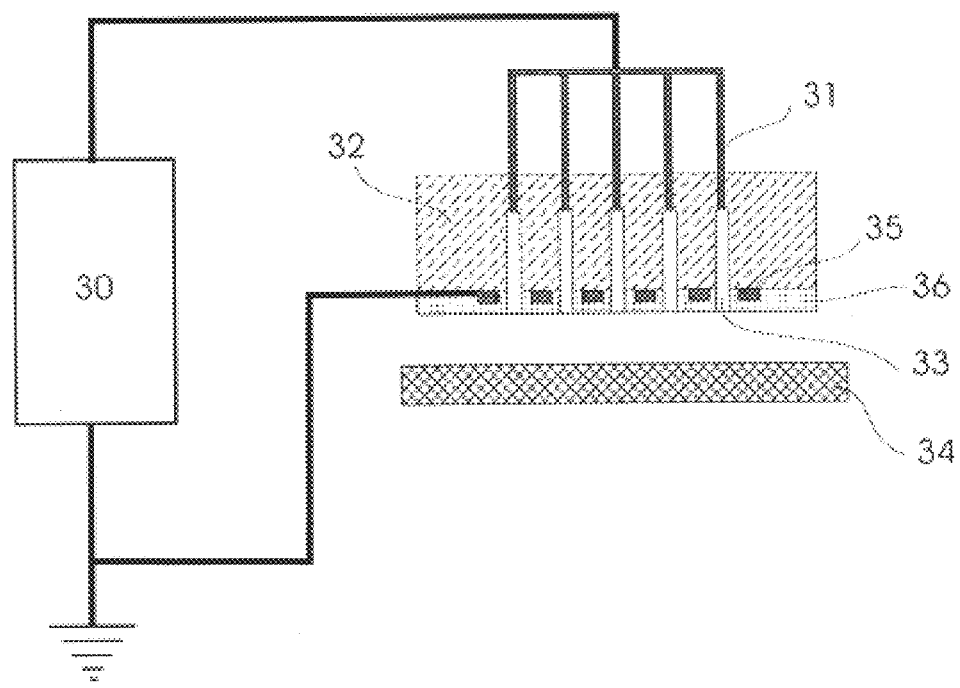
Figure 3:
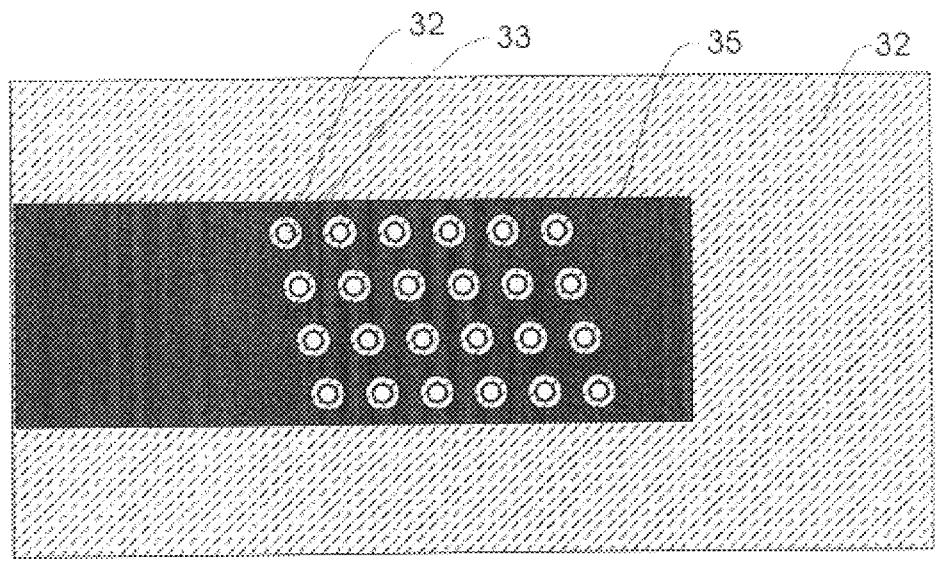
Figure 3:
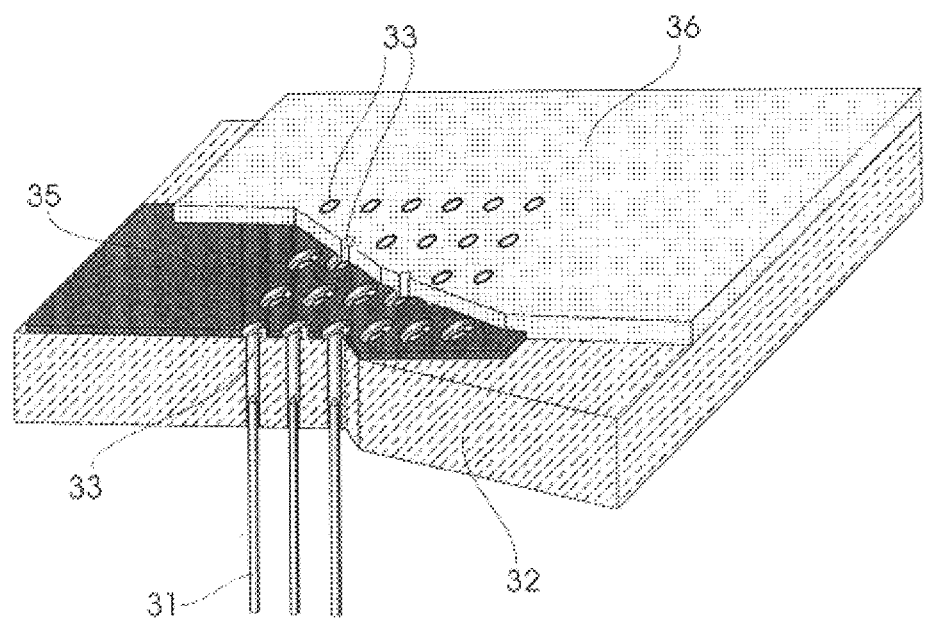

FIG. 3A is a schematic cross-sectional view of a capillary discharge plasma head of a C-type apparatus showing plasma from each capillary for plasma surface treatment for any one of conductive, semiconductive, and non-conductive workpieces.

FIG. 3B is a schematic cross-sectional view of a C-type apparatus for plasma surface treatment of one of conductive, semiconductive, and non-conductive workpieces. The apparatus includes an AC power supply 30, pin electrodes 31, a dielectric body 32, capillaries 33, a non-conductive workpiece 34, a counter electrode 35, and a dielectric plate 36. The counter electrode 35 is encapsulated by the dielectric body 32 and dielectric plate 36. The capillaries 33 are formed in the dielectric body 32 and the dielectric plate 36, so that the pin electrodes 31 are exposed by the capillaries 33. The AC power supply 30 has one of its terminals connected to the pin electrodes 31, and the other terminal connected to electrode 35 and grounded. The pin electrodes 31 are inserted into the dielectric body 32 and extend into the capillaries 33. The capillaries 33 formed in the dielectric body 32 may range in number from one to thousands depending upon the dimension of the dielectric body 32. A thickness of the dielectric body 32 including plate 36 may be in the range of 1 mm to 3 cm. A diameter of each capillary is preferably in the range of 0.2 to 0.8 mm. In the embodiment, any kind of workpieces, including conductive, semiconductive, and non-conductive, can be treated by the apparatus.

FIG. 3C illustrates the counter electrode 35 placed over the dielectric body 32. The capillaries 33 are formed through the counter electrode 35 and the dielectric body 32. As shown in FIG. 3C, the counter electrode 35 surrounds each capillary 33 and is separated from the capillary with a distance.

FIG. 3D shows a schematic cross-sectional view of the combined dielectric body 32 and the dielectric plate 36 with the counter electrode 35. The structure illustrates capillaries extending from one side of the structure to the other and the pin electrodes 31 inserted into the capillaries 33.

The capillaries may be formed in any shape in the dielectric body. In order to increase more efficiency in treating the workpiece, the capillary may be formed in the dielectric body having a parallelogram shape. By forming the dielectric body in a parallelogram shape, none of the plasma beam out of the capillaries overlaps one another in their moving direction of the workpiece plate on a conveyor.

Figure 4:
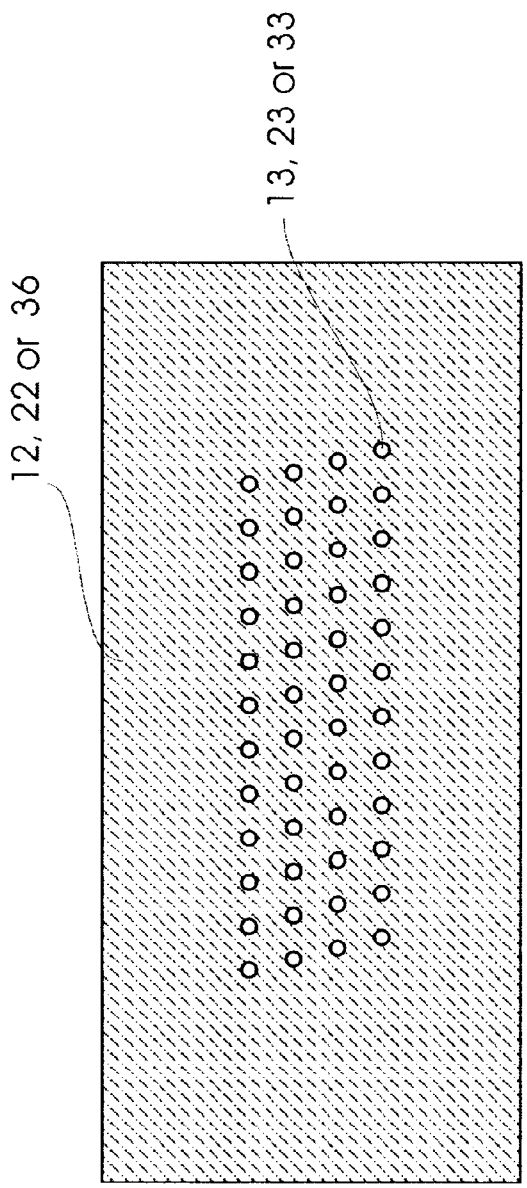
FIG. 4 is a plane view of a dielectric wherein the capillaries are placed in the dielectric body having a parallelogram shape in the present invention.

FIG. 4 is a plane view of a dielectric wherein the capillaries are placed in the dielectric body having a parallelogram shape in the present invention.

Figure 5:
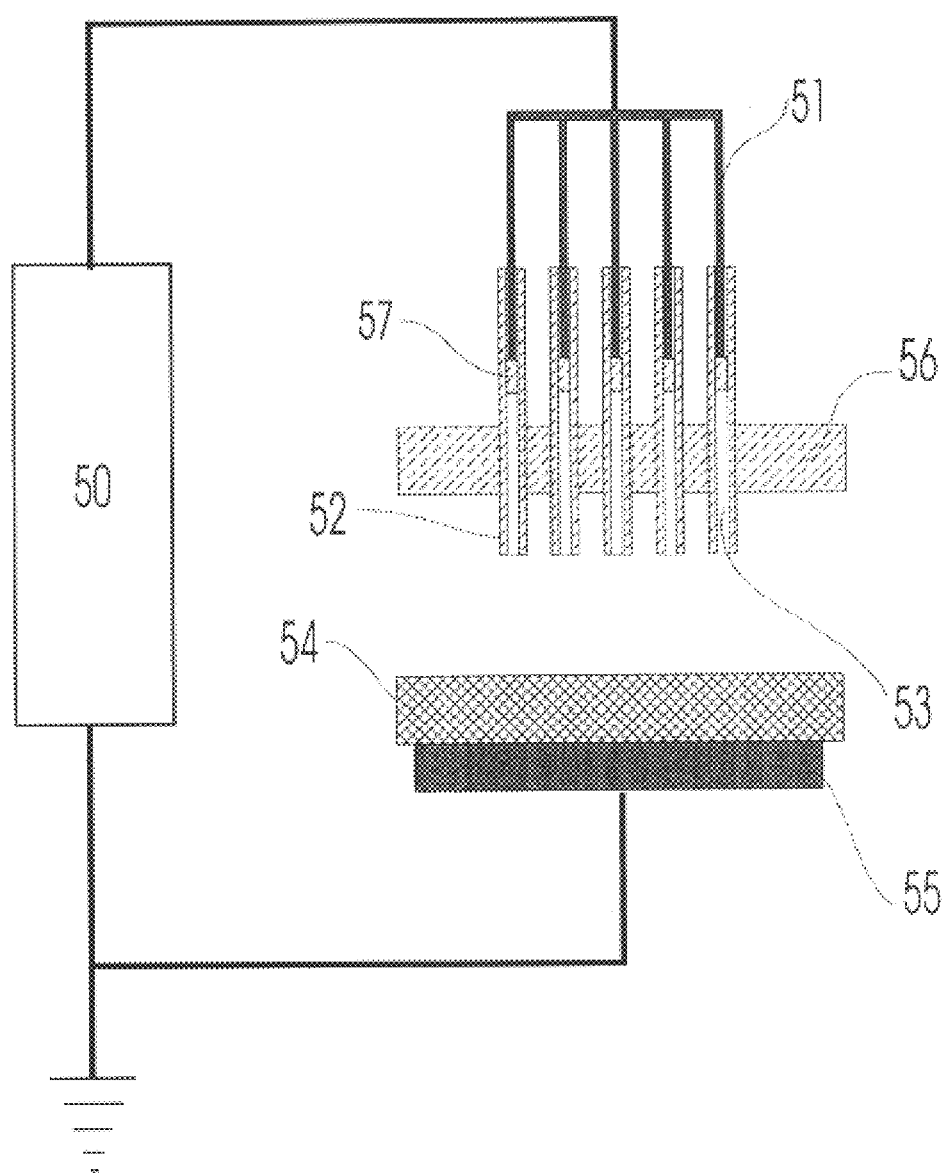
FIG. 5 is a schematic cross-sectional view illustrating a D-type apparatus for plasma surface treatment for conductive, semiconductive, and nonconductive workpieces in the present invention.

FIG. 5 is a schematic cross-sectional view illustrating a D-type apparatus for plasma surface treatment for one of conductive, semiconductive, and nonconductive workpieces. Similar to the A-type, apparatus shown in FIG. 1B, the D-type apparatus includes a power supply 50, pin electrodes 51, dielectric tubes 52 having capillaries 53, a counter electrode 55, a dielectric plate 56, and a dielectric bump 57. The dielectric plate 56 has at least one hole formed therethrough so that the dielectric tube 52 is combined with the dielectric plate 56 through the hole. The dielectric tube 52 has a length that may be in the range of 1 mm to 3 cm. The dielectric tubes 52 protrude beyond the dielectric plate 56 at both sides, and have capillaries formed therein. The dielectric tubes 52 can be made of any dielectric material such as ceramic, and have an inner diameter (i.e. a diameter of the capillaries 53) in the range of 0.2 mm to 0.8 mm. A piece of dielectric material or dielectric bump 57 is located within the capillaries, thereby preventing a glow-arc discharge transition in treating the conductive workpiece. A first terminal of the power supply 50 is connected to pin electrodes 51, while a second terminal is connected to the counter electrode 55 and is grounded. The pin electrodes 51 are inserted into the dielectric tubes 52 at a first end and extend up to the dielectric bump 57. A conductive, semi-conductive or non-conductive workpiece 54 is placed between the dielectric tube 52 and the counter electrode 55 and is subjected to plasma treatment.

Figure 6:
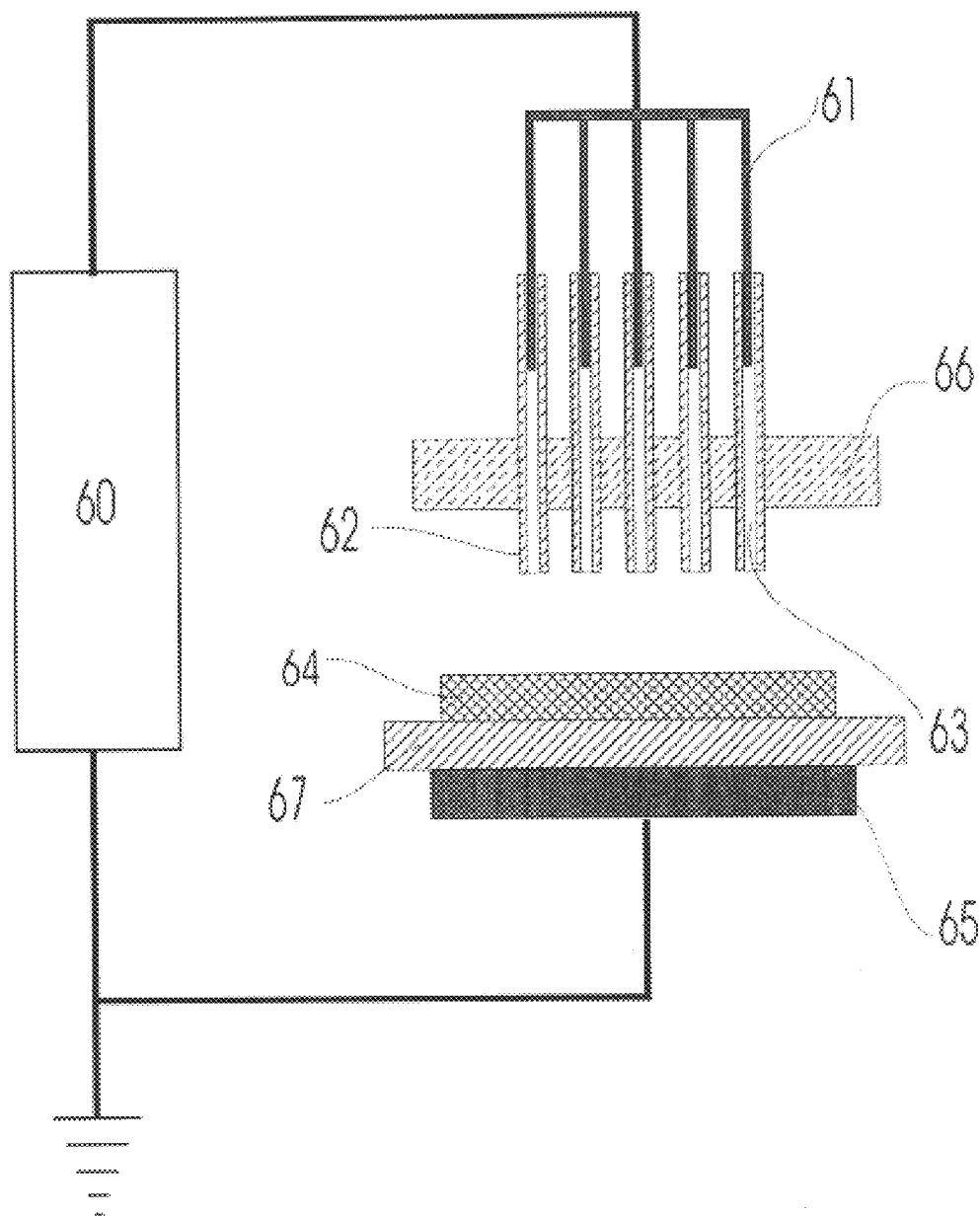
FIG. 6 is a schematic cross-sectional view illustrating an E-type apparatus for plasma surface treatment for nonconductive substrates in the present invention.

FIG. 6 is a schematic cross-sectional view illustrating an E-type apparatus for plasma surface treatment for nonconductive workpieces. Similar to the D-type apparatus shown in FIG. 5, the apparatus includes a power supply 60, pin electrodes 61, dielectric tubes 62 having capillaries 63, a counter electrode 65, a first dielectric plate 66, and a second dielectric plate 67. The first dielectric plate 66 has a plurality of holes formed therethrough. The dielectric tube 62 has a length that may be in the range of 1 mm to 3 cm. Within the holes of the first dielectric plate 66, a series of dielectric tubes 62 are fitted. The dielectric tubes 62 protrude beyond the first dielectric plate 66 at both sides, and have capillaries inside the tubes 62. A first terminal of the power supply 60 is connected to the pin electrodes 61, while a second terminal is connected to electrode 65 and grounded. The second dielectric plate 67 is located on the counter electrode 65. The non-conductive workpiece 64 is placed over the second dielectric plate 67 and is subjected to the plasma treatment.

Figure 7:
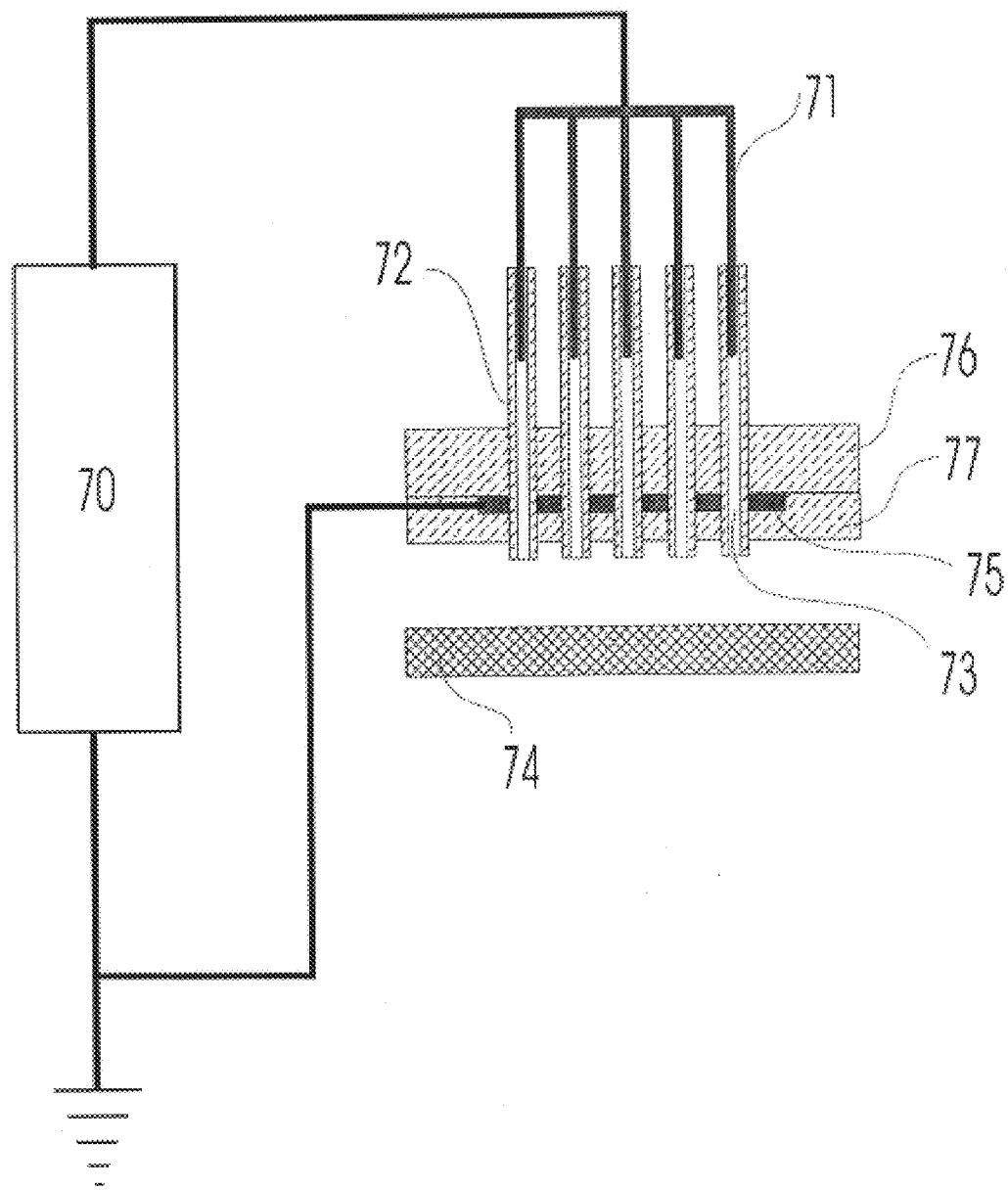
FIG. 7 is a schematic cross-sectional view illustrating an F-type apparatus for plasma surface treatment for conductive, semiconductive, and nonconductive workpieces in the present invention.

FIG. 7 is a schematic cross-sectional view illustrating an F-type apparatus for plasma surface treatment for conductive, semiconductive, and nonconductive workpieces. The apparatus includes a power supply 70, pin electrodes 71, dielectric tubes 72 having capillaries 73, a counter electrode 75, a dielectric body 76, and a dielectric plate 77 having a length in the range of 1 mm to 3 cm. The counter electrode 75 is buried by the dielectric body 76 and the dielectric plate 77. A plurality of holes extend through the dielectric body 76 and the dielectric plate 77 and the counter electrode 75 creating space for the dielectric tubes 72 to be fitted therein. The dielectric tubes 72 have capillaries therein. The power supply 70 has a first terminal connected to the pin electrodes 71 and a second terminal connected to the counter electrode 75. The second terminal is grounded. The pin electrodes 71 are located within capillaries 73. A conductive, semiconductive, and non-conductive workpiece 74 is treated by the F-type apparatus.

Figure 8:
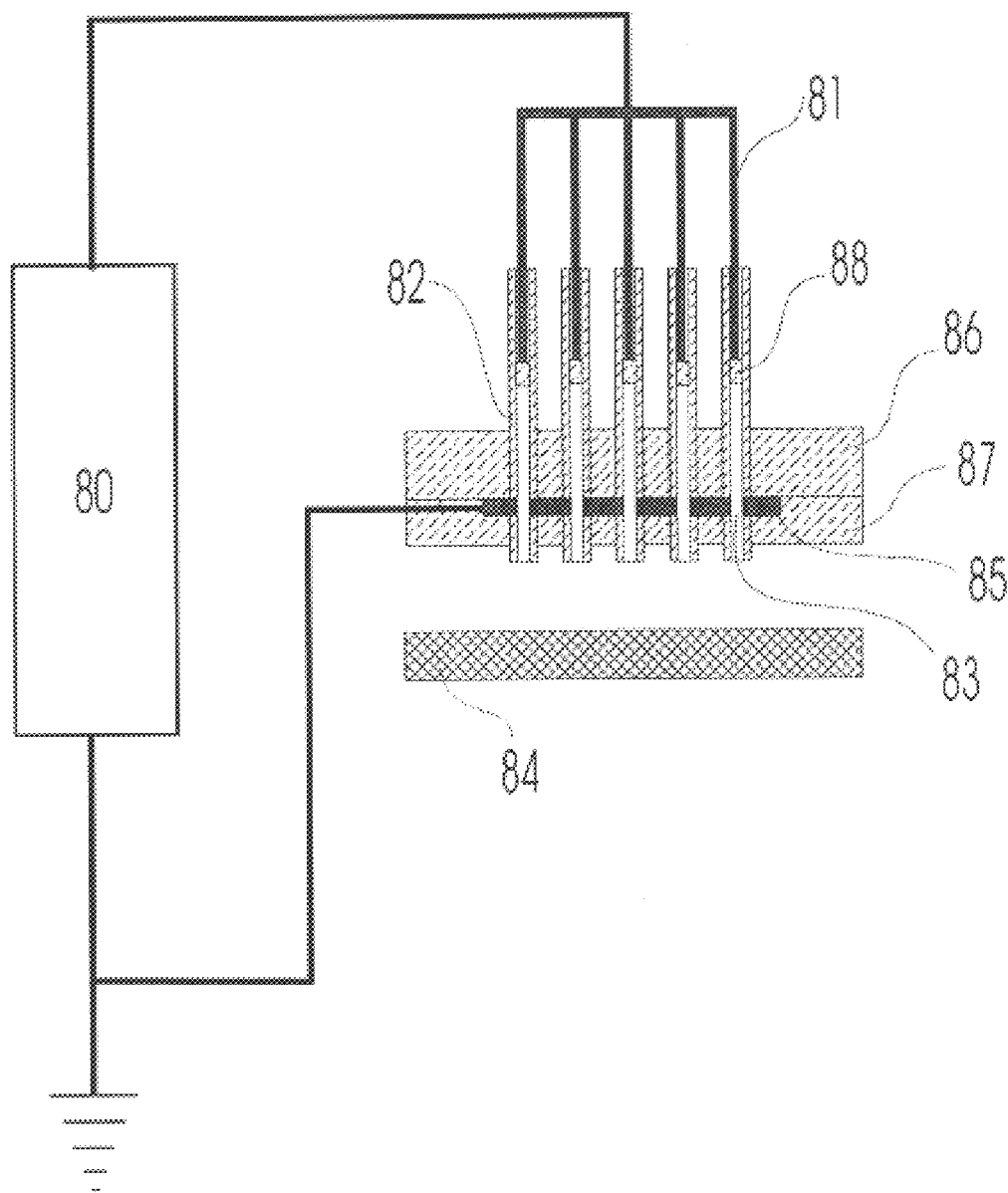
FIG. 8 is a schematic cross-sectional view illustrating a G-type apparatus for plasma surface treatment for conductive, semiconductive, and nonconductive workpieces in the present invention.

FIG. 8 is a schematic cross-sectional view illustrating a G-type apparatus for plasma surface treatment for conductive, semiconductive, and non-conductive workpieces. The apparatus includes a power supply 80, pin electrodes 81, dielectric tubes 82 having capillaries 83 in the dielectric tubes, a dielectric bump 88 located within the capillaries, a counter electrode 85, a dielectric body 86, and a dielectric plate 87. The counter electrode 85 is located between the dielectric body 86 and the dielectric plate 87 and held thereon. A plurality of holes extend through the dielectrics and the counter electrode 85 creating space for the dielectric tubes 82 to be fitted therein. A first terminal of power supply 80 is connected to pin electrodes 81, while a second terminal is connected to electrode 85 and grounded. The pin electrodes 81 are placed within the capillaries of the dielectric tubes 82 and extend up to the dielectric bump 88. A conductive, semiconductive, and non-conductive workpiece 84 is placed under the head of the pipe G-type apparatus and subjected to the plasma treatment.

Figure 9:
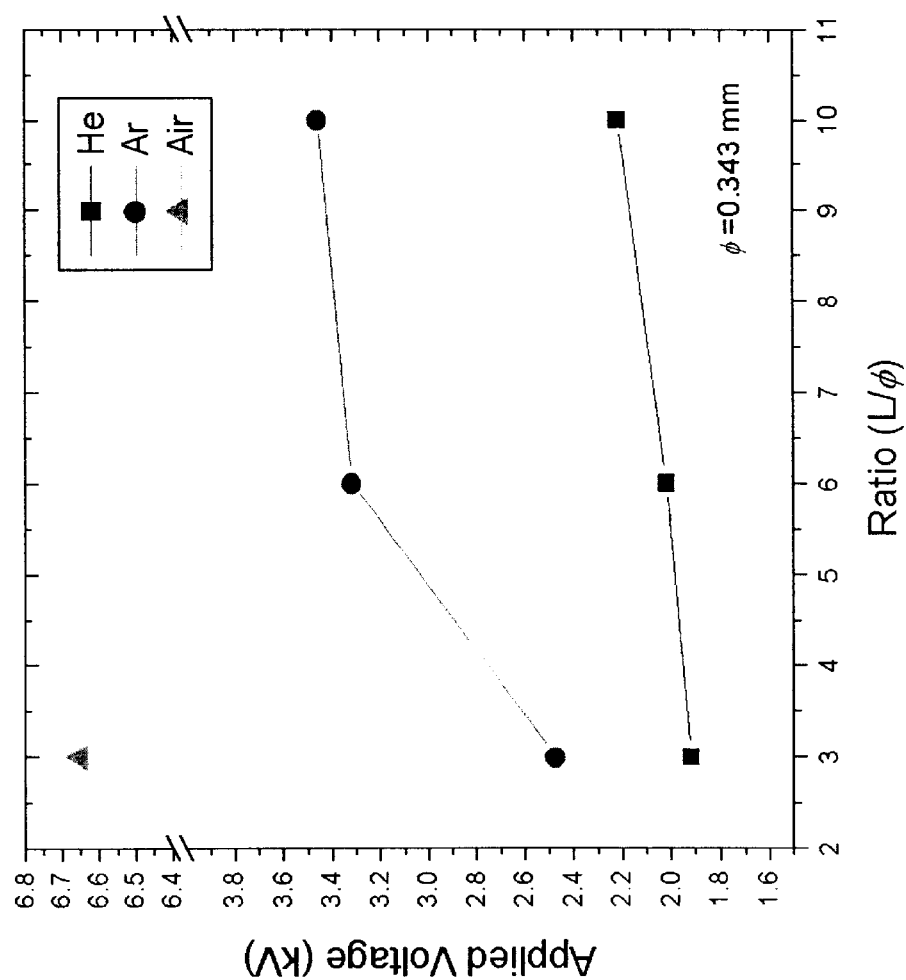
FIG. 9 shows the applied voltage for a variety of gases, relative to the ratio between the length and the diameter of the capillary at an atmospheric pressure of 760 Torr in generating Plasma in the present invention.

FIG. 9 is a diagram illustrating the applied voltages required to form a plasma shower using different gases. The applied voltages are approximately proportional to a ratio between the length and the diameter of the capillaries. The diagram illustrates the voltages required at an atmospheric pressure of 760 Torr. As shown in FIG. 9, smaller voltages are required to form a plasma shower discharge in a He gas environment while larger voltages are required to form a plasma discharge in an air environment.

Figure 10:
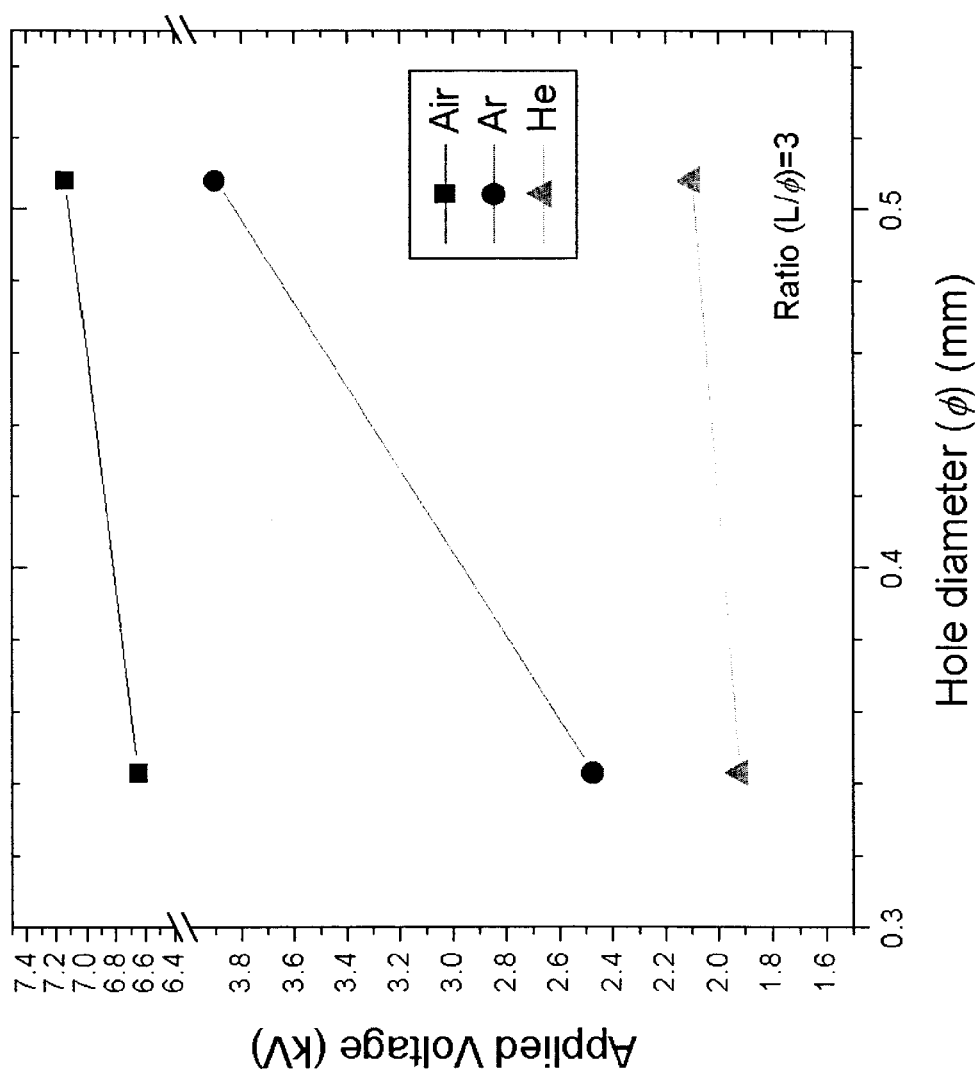
FIG. 10 shows the applied voltage relative to the diameter of the capillary for different gases in the present invention.

FIG. 10 illustrates applied voltages needed for capillary discharge under different gas environment. The applied voltage is approximately proportional to a diameter of the capillary. As illustrated in the diagram, when the chamber is filled with helium the applied voltage required to produce a plasma is less sensitive to the diameter of the capillary. However, when air is utilized, a substantial increase in the applied voltage is required as the diameter of the capillary increases.

Figure 11A:
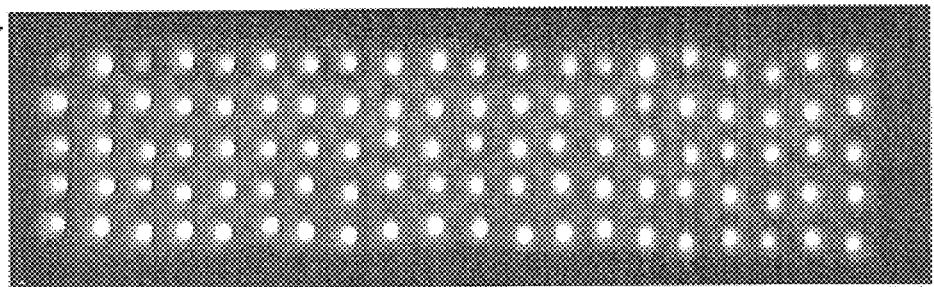
FIG. 11A shows a bottom view of the plasma shower head generating continuous plasma in an air environment in the present invention.
Figure 11B:
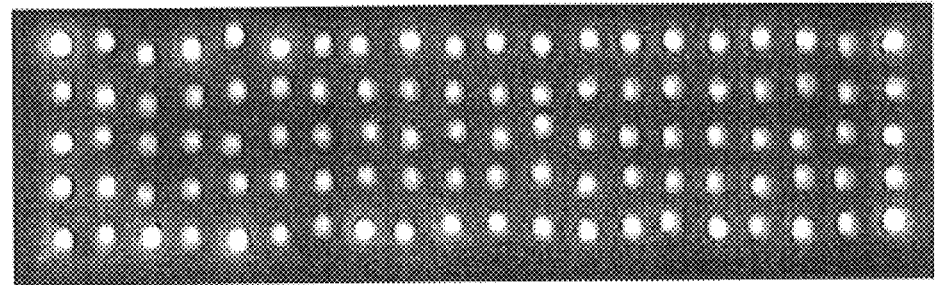
FIG. 11B shows a bottom view of the apparatus head generating plasma in an Ar environment in the present invention.
Figure 11C:
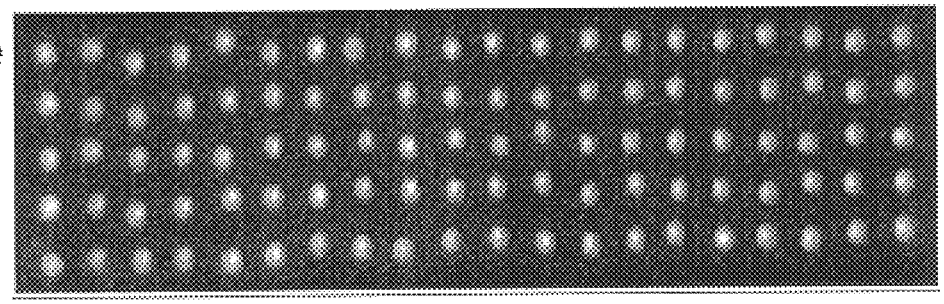
FIG. 11C shows a bottom view of the apparatus head generating plasma in a He environment in the present invention.

FIGS. 11A to 11C show bottom views of the plasma apparatus head of the present invention generating continuous plasma in an air, Ar, and He environments. However, the apparatus of the present invention may be operated in any kind of working gas environment.

In order to demonstrate a feasibility of practical applications in industries, a wetting angle of water droplets is measured in various conditions.

Figure 12:
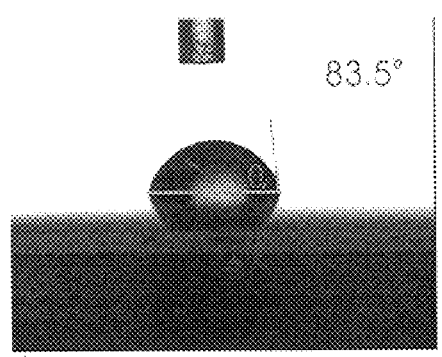
FIG. 12A shows a water droplet initially placed on an untreated printed circuit board in the present invention.
FIG. 12B shows the water droplet placed on an air plasma treated printed circuit board after 20 seconds plasma treatment in the present invention.
FIG. 12C illustrates an air plasma treated area of the printed circuit board after 80 seconds plasma treatment in the present invention.
FIG. 12D shows the water droplet placed on the air plasma treated printed circuit board after 80 seconds plasma treatment in the present invention.
Figure 12:
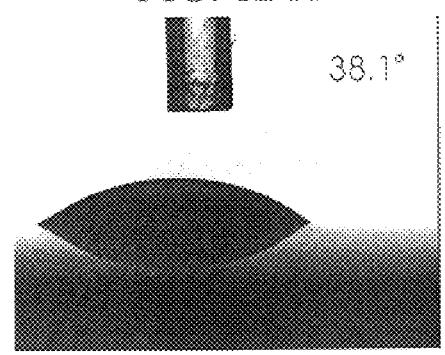
Figure 12:
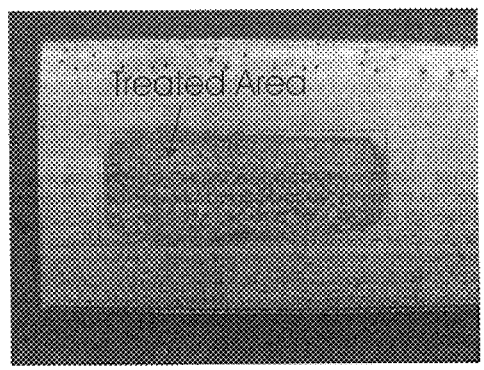
Figure 12:
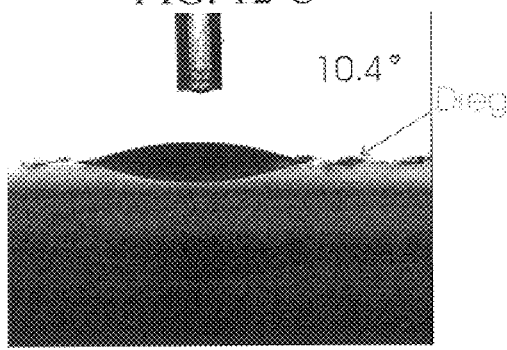

FIG. 12A shows a water droplet initially placed on an untreated printed circuit board in the present invention. As illustrated in the diagram, the water droplet has an initial wetting angle of 83.5° relative to the board.

FIG. 12B shows the water droplet 20 seconds after being placed on an air plasma treated printed circuit board. As illustrated in FIG. 12B, the wetting angle relative to the board decreases to 38.1°.

FIG. 12C illustrates an air plasma treated area of the printed circuit board after 80 seconds plasma treatment.

FIG. 12D shows the water droplet placed on an air plasma treated printed circuit board after 80 seconds plasma treatment. The wetting angle decreases to 10.4°. Accordingly, as shown in FIGS. 12A–12D, the surface of the treated area of the workpiece becomes more active.

Figure 13:
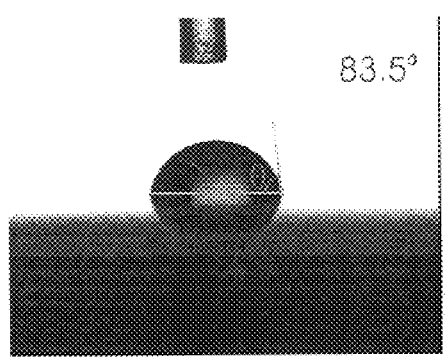
FIG. 13A shows a water droplet initially placed on an untreated printed circuit board in the present invention.
FIG. 13B shows the water droplet placed on the Ar plasma treated substrate after 20 seconds plasma treatment in the present invention.
FIG. 13C illustrates an Ar plasma treated area of the printed circuit board in the present invention.
FIG. 13D shows the water droplet placed on the Ar plasma treated printed circuit board after 80 seconds plasma treatment in the present invention.
Figure 13:
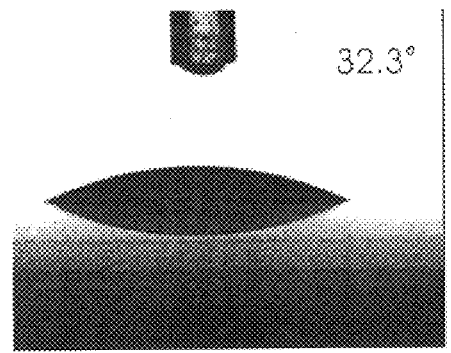
Figure 13:
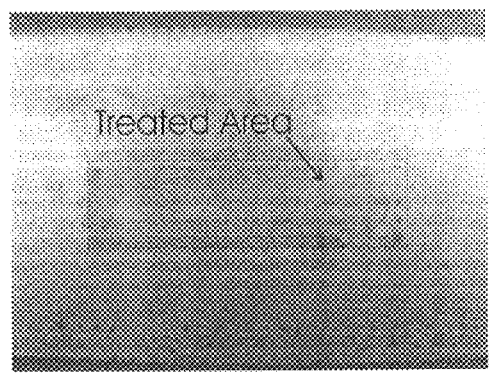
Figure 13:
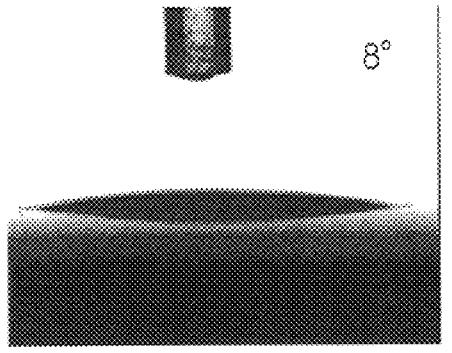

FIGS. 13A to 13D illustrate the wetting angle of water droplets placed on an Ar plasma treated printed circuit board. FIG. 13A shows a water droplet initially placed over an untreated printed circuit board. A wetting angle between the water droplet and the workpiece is initially 83.5°.

After 20 seconds of plasma treatment, the wetting angle between the water droplet and the workpiece decreases to 32.3°, as shown in FIG. 13B.

FIG. 13C shows an Ar plasma treated area of the workpiece, while FIG. 13D shows the wetting angle between the water droplet and the workpiece 80 seconds after the water droplet has been placed on the workpiece. As shown in FIG. 13D, the wetting angle decreases to 8°. As demonstrated above, either air or Argon plasma effectively treat the workpiece under various conditions.

It will be apparent to those skilled in the art that various modifications and variations can be made in the method and apparatus for treatment using capillary electrode discharge plasma shower of the present invention without departing from the scope or spirit of the invention. Thus, it is intended that the present invention covers the modifications and variations of the invention provided they come within the scope of the appended claims and their equivalents.

What is claimed is:

1. An apparatus for treating a workpiece using a plasma, comprising:
    at least one pin electrode for receiving a power source;
    a dielectric body having first and second sides, and at least one capillary partially extending from the first to the second side of the dielectric body, each capillary being substantially aligned with each pin electrode;
    a dielectric plate coupled to the dielectric body the capillary extending therethrough; and
    a counter electrode disposed between the dielectric body and the dielectric plate having at least one capillary extending therethrough and electrically coupled to the pin electrode for generating the plasma from each capillary.

2. The apparatus according to claim 1, further comprising an AC power supply coupled to the pin electrode and the counter electrode.

3. The apparatus according to claim 1, wherein the dielectric body has a thickness in the range of 1 mm to 3 cm.

4. The apparatus according to claim 1, wherein the capillary has a diameter in the range of 0.2 mm to 0.8 mm.

5. The apparatus according to claim 1, wherein the workpiece is conductive.

6. The apparatus according to claim 1, wherein the pin electrode is exposed to the workpiece through the capillary.

7. The apparatus according to claim 1, wherein the counter electrode is placed in close proximity to the capillary formed in both the dielectric body and the dielectric plate, and the dielectric plate directly faces toward the workpiece.

8. The apparatus according to claim 7, wherein the workpiece is one of conductive, semiconductive, and non-conductive.

9. The apparatus according to claim 1, wherein the capillary is placed in the dielectric body to have a parallelogram shape.

* * * * *